United States Patent [19]

Moriya et al.

[11] 3,995,218
[45] Nov. 30, 1976

[54] ADAPTIVE DELTA MODULATION SYSTEM FOR CORRECTING MISTRACKING

[75] Inventors: Takao Moriya, Yamato; Kazuo Murano, Tokyo, both of Japan

[73] Assignee: Fujitsu Ltd., Kawasaki, Japan

[22] Filed: Dec. 20, 1974

[21] Appl. No.: 534,878

[30] Foreign Application Priority Data
Dec. 28, 1973 Japan.................................. 49-312

[52] U.S. Cl. ............................. 325/38 B; 332/11 D
[51] Int. Cl.² ....................................... H03K 13/22
[58] Field of Search .................. 325/38 B; 332/11 D

[56] References Cited
UNITED STATES PATENTS

| | | | |
|---|---|---|---|
| 3,621,396 | 11/1971 | Daugherty | 325/38 B |
| 3,706,944 | 12/1972 | Tewksbury | 325/38 B |
| 3,723,909 | 3/1973 | Condon | 325/38 B |
| 3,766,542 | 10/1973 | Tomozawa | 325/38 B |

Primary Examiner—Robert L. Griffin
Assistant Examiner—Jin F. Ng
Attorney, Agent, or Firm—Staas & Halsey

[57] ABSTRACT

The present invention disclosed an adaptive delta modulation system which examines the several preceding bits of an output of the adaptive delta modulation, and discretely changes a quantizing stepsize of said output so as to compand the same. According to the present invention the system detects the several preceding bits of the output of the adaptive delta modulation, changes the stepsize of that output, counts the output bits of the adaptive delta modulation from the time when stepsize changes, regardless of whether the output is "0" or "1", and changes said stepsize when the counted value reaches a value which is predetermined in accordance with the quantizing stepsize at that time thereby correcting the mistracking which is generated in an adaptation logic circuit between a coder terminal and decoder terminal.

5 Claims, 11 Drawing Figures

ADAPTIVE DELTA MODULATION SYSTEM FOR CORRECTING MISTRACKING

BACKGROUND OF THE INVENTION

1. Field of the Invention

The present invention relates to an adaptive delta modulation system which automatically corrects the crossing between a coder terminal and a decoder terminal of a delta modulation signal occurring in the adaptation logic circuit of the system.

2. Description of the Prior Art

Within a conventional adaptive delta modulation system, in the coder terminal, an analog input signal is supplied to the first input terminal of a comparator of an adaptive coder, the output of the comparator is fed back via an integrator circuit to a second input terminal of the comparator so as to compare the output of the integrator circuit with the analog input signal, and determine whether the output digital coded signal "0" or "1" from the comparator, in accordance with whether output of the integrator circuit is either larger or smaller than the analog input signal. The output of the comparator is supplied to the adaptation logic circuit. The adaptation logic circuit examines whether the continuous bit outputs of the comparator remain constant (that is: 0 or 1) or not, and discretely changes the quantum stepsize in accordance with the companding law and initiates the signal output of the adaptive delta modulation. In the decoder terminal, the received signal of the adaptive delta modulation is supplied to a adaptation logic circuit, which is similar to that in the coder terminal, except for the carrying out of an inverse companding function, and the output of the adaptation logic circuit is supplied via an integrator to a low pass filter which produces a demodulated analog output signal.

In the above-mentioned conventional system, it is well known that sufficient dynamic range can be obtained when the companding law and a suitable number of different stepsizes is selected. However, one problem is that, when the signal is demodulated, the initial conditions of the coder and decoder terminal are not coincident. Therefore, if the initial conditions of the coder and decoder terminals are not preset, the adaptation logic circuit tracking is delayed between the coder terminal and decoder terminal, that is, a mis-tracking occurs and normal functioning of the system can not be expected. If the adaptative logic circuit in the coder and decoder terminals are operated normally, mistracking is due to a faulty transmission line. The methods of overcoming the above-mentioned drawback are (i) to transfer to a minimum stepsize after idle channel state or (ii) to transfer to a maximum stepsize in the case of overload. However, in the normal functional state, the probability of the maximum stepsize being realized is very small, and the function in the idle channel state is not realized when background noise exists or a data signal is transmitted via an acoustic coupler. Therefore, abovementioned mistracking should be corrected by using some other suitable means.

For the purpose of eliminating said mistracking a method has been proposed which provides, beside the transmission line for the adaptive delta modulation signal, a low speed transmission line for sending information concerning the state of the adaptation logic circuit in the coder terminal and for correcting mistracking, in the decoder terminal. This method can eliminate mistracking completely, however another transmission line is required and this complicates the apparatus somewhat.

An alternative method is proposed in which the stepsize of two bits of the same kind (that is "0" "0" or "1" "1"), is raised one stepsize, or if said two bits are of a different king (that is: "0" "1" or "1" "0"), the stepsize is dropped to the minimum stepsize. In this method, the adaptation logic circuits in the coder terminal and the decoder terminal transfer to the minimum stepsize every time successive different signals are produced and mistracking can be corrected automatically. However, in this method, sufficient dynamic range can not be obtained, for example, when the voice signal is transmitted.

SUMMARY OF THE INVENTION

An object of the present invention is to overcome the above-mentioned drawback and to provide an adaptive delta modulation system which automatically corrects the mistracking of the adaptive delta modulation signal in the adaptation logic circuit in the coder and decoder terminals within a sufficiently large dynamic range.

In achieving the above-mentioned object, according to the present invention, the adaptive delta modulation system which examines the several preceding bits of an output of the adaptive delta modulation, discretely changes the quantizing stepsize of said output so as to compand said output. A characteristic feature of the present invention comprises a first means for detecting the first several bits of said output of said adaptive delta modulation and changing the stepsize of said output, and a second means for counting the output bits of said adaptive delta modulation regardless of said output being 0 or 1, from the time when the stepsize changes, and changing said stepsize independently or with a relation to said first means when the counted value reaches a value which is predetermined in accordance with said quantizing stepsize at that time thereby correcting the mistracking which is generated in an adaptation logic circuit between a coder terminal and decoder terminal.

Further features and advantages of the present invention will be apparent from the ensuing description with reference to the accompanying drawings to which, however, the scope of the invention is in no way limited.

BRIEF DESCRIPTION OF THE DRAWINGS

FIG. 3I is a schematic diagram of a decoder as illustrated in FIGS. 3G and 3H.

DETAILED DESCRIPTION OF THE PRESENT INVENTION

Figure 1:
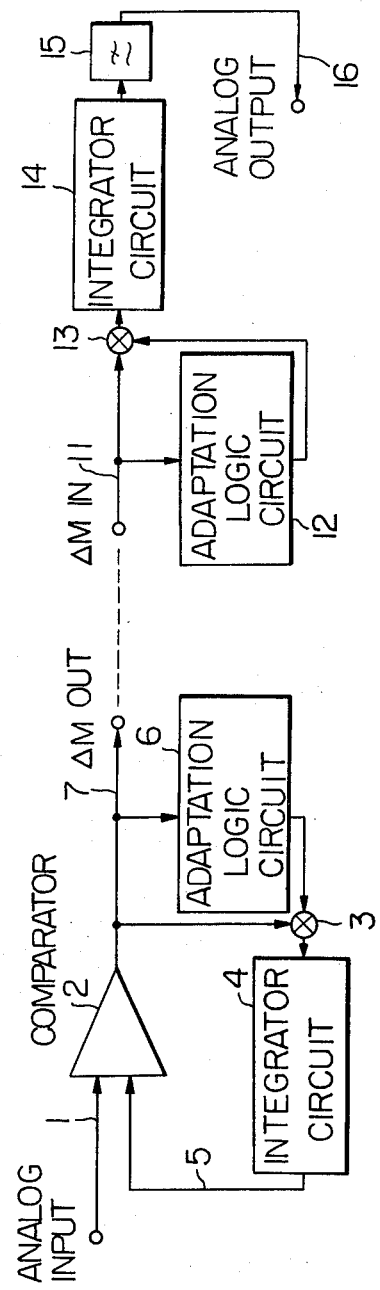
FIG. 1 is a block diagram of the conventional adaptive delta modulation system.

Referring to FIG. 1 which shows the conventional adaptive delta modulation system, in the coder terminal an analog input 1 is supplied to one input terminal of a comparator 2, the output of the comparator 2 is supplied via a junction point 3 to an integrator circuit 4 which integrates the output of the comparator 2 and applies the output of the integrator circuit 4 to another input terminal of the comparator 2. The comparator 2 compares the analog input signal 1 and the output 5 of the integrator circuit 4 and, in accordance with whether the analog input signal is larger or smaller than the output of the integrator 4, applies the digital signal 1 or 0 to an adaptation logic circuit 6. The adaptation logic circuit 6 determines whether consecutive two input bits are of the same, (that is, 1 1 or 0 0) or a different kind (that is, 1 0 or 0 1) and discretely changes the quantizing stepsize of the analog input, so as to compand the analog input signal, and sends the output of the circuit 6 to the decoder terminal. In the decoder terminal, the received adaptive delta modulation signal 11 is supplied to an adaptation logic circuit 12, which is similar to that in the coder terminal except for the carrying out of an inverse companding function, and the output of the adaptation logic circuit 12 is supplied via a junction point 13 and an integrator circuit 14 to a low pass filter 15 which produces a demodulated analog output signal 16.

A basic idea of the present invention is that, in addition to the conventional law of adaptation logic which changes the stepsize, a law is used which is determined in accordance with the stepsize actually employed.

Table 1 shows a relation between sending and receiving signals and stepsizes according to the conventional adaptation logic law: that is when continuous N1 bits are of the same signal (that is, 0, 0, ... or 1, 1, ... ) the stepsize doubles, and when different signals continue successively N2 bits (that is, 0, 1, 0, 1, ... or 1, 0, 1, 0, ... ) the stepsize halves. In Table 1 the mistracking of the stepsizes between code and decode terminals when an error (mark $x$) is produced in the transmission line are marked *.

This is, the number No. 4, No. 3, No. 2, No. 1 correspond to values of the stepsize 1, ½, ¼, ⅛. The changing of stepsizes provides the companding characteristics to the input signal.

As is clear from Table 1, once an error is produced, the period of disaccord between the sending stepsize and the receiving stepsize is prolonged, that is, mistracking is produced.

The present invention, in addition to the conventional adaptation logic law, incorporates the following law: that is, "When $K_l$ bits are counted from the time when stepsize changes, said stepsize divides by half", wherein $$K_l = 4 \times 2^{(L-l)} + 1 \qquad 1.$$

$2^L$; the maximum stepsize
$2^l$; the stepsize which is used ($1 \leq l \leq L$)

Table II shows the relation between the sending and receiving signals and the sending and receiving stepsizes when the adaptation logic law is applied to the present invention. Also, in Table II, the discrepancy of the stepsizes between the coding and decoding terminals when an error (marked $x$) is produced in the transmission line is asterisked. When both the conventional law and the law according to the present invention are realized simultaneously, the conventional law should take priority.

TABLE II

| Sending Code | 1 | 1 | 1 | 1 | 0 | 0 | 0 | 0 | 1 | 1 | 1 | 0 | 1 | 0 | 0 | 1 | 0 | 0 |
|---|---|---|---|---|---|---|---|---|---|---|---|---|---|---|---|---|---|---|
| | | | | x | | | | | | | | | | | | | | |
| Received Code | 1 | 1 | 1 | 0 | 0 | 0 | 0 | 0 | 1 | 1 | 1 | 0 | 1 | 0 | 0 | 1 | 0 | 0 |
| Sending Stepsize | 2 | 2 | 2 | 3 | 3 | 3 | 3 | 4 | 4 | 4 | 4 | 3 | 3 | 2 | 2 | 2 | 2 | 2 |
| | | | | * | * | * | | * | * | * | * | | | | | | | |
| Received Stepsize | 2 | 2 | 2 | 2 | 2 | 2 | 3 | 3 | 3 | 3 | 3 | 3 | 3 | 2 | 2 | 2 | 2 | 2 |

In Table II, beside the adaptation logic law in which it is assumed that N1=4 and N2=4, L=4 according to the law shown in equation (1) is also applied. That is, with respect to No. 4, when four bits are counted, the stepsize divides by half; with respect to No. 4, when eight bits are counted, the stepsize divides further by half; and with respect to No. 4, when 16 bits are counted, the stepsize divides in half again.

By applying the above-mentioned adaptation logic law, the discrepancy (asterisked) between the sending and receiving stepsizes can be shortened in comparison with the period shown in Table I.

In the case when the adaptation logic is actually realized, the following algorithm is preferable in point of view of its characteristics and its hardware constitution.

When we assume that the proportion of the stepsize is shown by $$1 : a : a^2 : \ldots : a^{L-1}$$

(wherein $a$ is a positive integer, L is the number of

TABLE I

| Sending Code | 1 | 1 | 1 | 1 | 0 | 0 | 0 | 0 | 1 | 1 | 1 | 0 | 1 | 0 | 0 | 1 | 0 | 0 |
|---|---|---|---|---|---|---|---|---|---|---|---|---|---|---|---|---|---|---|
| | | | | x | | | | | | | | | | | | | | |
| Received Code | 1 | 1 | 1 | 0 | 0 | 0 | 0 | 0 | 1 | 1 | 1 | 0 | 1 | 0 | 0 | 1 | 0 | 0 |
| Sending Stepsize | 2 | 2 | 2 | 3 | 3 | 3 | 3 | 4 | 4 | 4 | 4 | 4 | 4 | 3 | 3 | 3 | 3 | 3 |
| | | | | * | * | * | | * | * | * | * | * | * | * | * | * | * | * |
| Received Stepsize | 2 | 2 | 2 | 2 | 2 | 2 | 3 | 3 | 3 | 3 | 3 | 3 | 3 | 2 | 2 | 2 | 2 | 2 |

In the Table 1, we assumed that N1=4, N2=4, and L (a number of discrete stepsizes)=4, and numerical values of the stepsize show the number of the stepsize.

quantum stepsizes), the adaptation logic is generally shown according to the following Table III.

TABLE III

| | | |
|---|---|---|
| A | N continuous same signal bits | multiply the stepsize by $a$ |
| B | M continuous alternate signal bits | multiply the stepsize by $\frac{1}{a}$ |
| C | When the Kl bits are counted from the time when the stepsize is changed | multiply the stepsize by $\frac{1}{a}$ |

In Table III, $K_l$ is the value of an integer and is determined by the value of the stepsize. That is, K1 is the value of an integer corresponding to the stepsize number No. 1 (a minimum stepsize), K2 is the value of an integer corresponding to the stepsize number No. 2, similarly, $Kn$ ($1 \leq n \leq L$) is the value of an integer corresponding to the stepsize No. $n$.

For the purpose of generally realizing the adaptation logic, it is convenient to determine the values of the parameter L, N, M, $a$, Kn ($1 \leq n \leq L$) as shown in Table IV.

TABLE IV

| No. | L | a | N | M | Kn (1 n L) | | | |
|---|---|---|---|---|---|---|---|---|
| 1 | 6 | 2 | 4 | 6 | K1=∞, | K2=32, | K3=24 | |
| | | | | | K4=16, | K5=12, | K6=8 | |
| 2 | 7 | 2 | 4 | 6 | K1=∞, | K2=48, | K3=32 | |
| | | | | | K4=24, | K5=16, | K6=12, | K7=8 |
| 3 | 8 | 2 | 4 | 6 | K1=∞, | K2=64, | K3=48, | K4=32 |
| | | | | | K5=24, | K6=16, | K7=12, | K8=8 |
| 4 | 4 | 4 | 7 | 8 | K1=∞, | K2=96, | K3=64, | K4=48 |
| 5 | 4 | 4 | 5 | 6 | K1=∞, | K2=96, | K3=64, | K4=48 |

In Table IV, the differences between No. 1, No. 2 and No. 3 are only that the numbers of the adaptation stepsize are 6, 7 and 8 respectively. We chose $a=2$, since the effect of adaptation logic becomes increasingly evident, the constitution of the hardware is simplified and the stability of the sytem improves. With respect to the values of N and M, generally, both are selected so that they are either equal or have a difference between them of 1. Frequently in the case of the present invention, small stepsize is used. Therefore, it is preferable to select a value of N slightly larger than that of M. When the value of Kn is large, a long time is required for correcting the adaptation mistracking, however the adaptation characteristic is clearly superior. Contrastingly, when the value of Kn is small, the adaptation mistracking can be easily corrected however, the adaptation characteristic is inferior. Therefore, the value of Kn should be selected taking the above-mentioned circumstances into consideration. The values of Kn which are shown in No. 1 – No. 3 in Table IV are selected so as to satisfy the above-mentioned requirements. Further, these values of Kn can be realized easily using a binary counter.

In No. 4 and No. 5 in Table IV, a proportion between stepsizes ($a$) is selected to be 4, for the purpose of decreasing the number of the adaptation stepsizes (L=4) and increasing the dynamic range so as to realize an economical adaptation logic circuit. In this case, the values of N and M should be carefully selected so as to prevent any instability in the adaptation logic circuit. Actually, it should be $N \geq a$ $M \geq a$, and when N=a, M should be selected as an odd number for maintaining the adaptation logic circuit in stable condition. Therefore, in No. 4 in Table IV, the values N=7, M=8, and in No. 5 in Table IV, the values N=5, M=6 are selected to satisfy the above-mentioned conditions. The reason that values of Kn in No. 4 and No. 5 in Table IV are significantly larger than that of Kn in No. 1 – No. 3 in Table IV is detailed in the following explanation. Because $a$ has a large value ($a=4$) the effective function of C in Table III becomes considerable and the adaptation characteristic deteriorates. Therefore, it is necessary that the function of C in Table III should be decreased.

Figure 2:
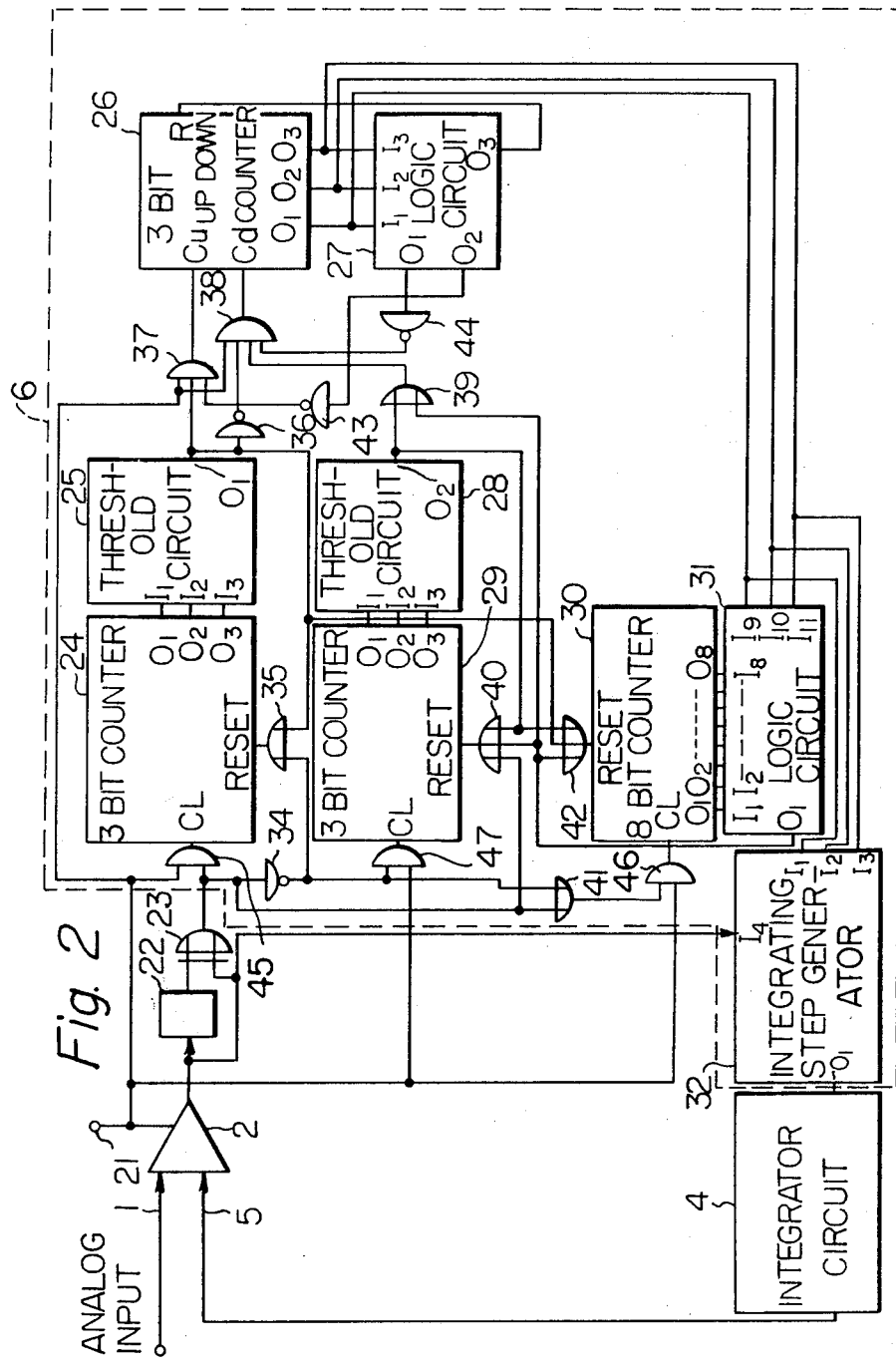
FIG. 2 is a block diagram of the adaptive delta modulation system according to the present invention.

FIG. 2 is a block diagram of an embodiment according to the present invention which is hereinbefore explained. In the figure, while the analog input 1, the comparator 2, the integral circuit 4 are as shown in FIG. 1, the delta modulated output of the comparator 2 is supplied into an adaptation logic circuit 6 via a delay circuit 22 and an exclusive OR gate 23 and at the same time is supplied to an integrator circuit 4 via an integrating step generator 32 which corresponds to a junction point 3 in FIG. 1.

The adaptation logic circuit 6 of the present invention employs four counters, of which the three bit counter 24 counts the bit sequence of the bit pattern 1111 ..., or 000 ..., of a signal of the delta modulation output, the three bit counter 29 counts the bit sequence of the bit pattern 1010 ... or 0101 ..., and the eight bit counter 30 counts the clock pulse from the time when the quantizing stepsize changes, regardless of the output signal. These three counters are connected in parallel via AND gates 45, 47, 46 respectively, with respect to the output of the exclusive OR gate 23 and the output of the sampling clock 21. When the counter 24 is in operation, the counter 29 is inhibited by an invertor 34, while the counter 30 counts the combined bit sequence in the counter 24 and the counter 29 through the OR gate 41.

The three bit up-down counter 26 determines the quantizing stepsize.

A threshold circuit 25 detects the time when the value of the counter 24 reaches 4 and the up-down counter 26 is counted up to raise one step in stepsize via the AND gate 37, while a threshold circuit 28 detects the time when the value of the counter 29 reaches 5, and the up-down counter 26 is counted down to fall one step in stepsize via the OR gate 39 and the AND gate 38. Furthermore, the AND gates 37, 38 are supplied with a clock pulse from the sampling clock 21. When the value of the counter 26 is fed to the logic circuit 27 and when the level which corresponds to the maximum stepsize is detected by the logic circuit 27, the counter 26 is inhibited of from counting up via the invertor 43 and the AND gate 37, while the level which corresponds to the minimum stepsize is detected by the logic circuit 27, the counter 26 is inhibited from counting down via the invertor 44 and the AND gate 38. Also, in the case that the level of the counter 26 does not correspond with any stepsize, the counter 26 is reset.

The level of the counter 26 is read by the logic circuit 31 and the stepsize used at each time point is detected. The threshold level is determined according to the stepsize and when the value of the counter 30 equals the threshold level, the counter 26 is counted down to fall by one step in stepsize through the OR gate 39 and the AND gate 38. In the present embodiment, for the purpose by giving a priority to counting up of the counter 26 caused by the output of the threshold circuit 25, an invertor 36 is provided between the output of the threshold circuit 25 and the AND gate 38 to inhibit counting down by the counter 26, so that the counter 26 is counted up when both outputs of the threshold circuit 25 and the logic circuit 31 become 1. And the output of the logic circuit 31 and the output of the threshold circuit 28 are supplied to an OR gate 39. Therefore, the counter 26 is counted down when the value 1 is supplied from at least, either logic circuit 31 or the threshold circuit 28 to the OR gate 39 and the output of the threshold circuit 25 is 0.

The counter 24 is reset when the successive two bits of the delta modulated output signal passing through the OR gate 35 are of different kinds or when the stepsize is raised by one level. In the same way, the counter 29 is reset when two successive bits of the delta modulated output signal passing through the OR gate 40 are of the same kind or when the stepsize is lowered one step. The counter 30 is reset when a change is effected to the stepsize through the OR gate 42. The value of the counter 26 is read by the integrating step generator 32, wherein the wave form of a correct step is generated and is applied to the integrator circuit 4 after positive or negative polarity is given thereto in accordance with the delta modulated signal output. The output of the integrator circuit 4 is compared with the analog input 2 in the comparator 1. In the delay circuit 22, the delta modulated signal is delayed by one sampling time and the exclusive OR gate 23 supplies the inputs of the adaptation logic circuit by sending the code 1 when the continuous two bits are of the same kind and the code 0 when the continuous two bits are of different kinds.

Figure 3A:
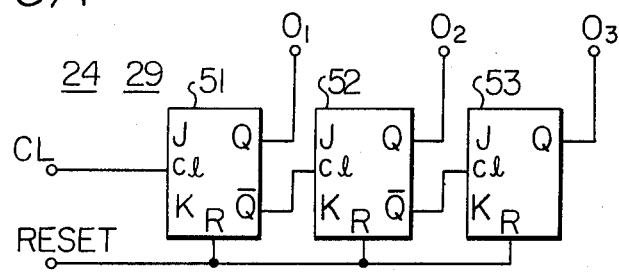
FIG. 3A shows a detailed block diagram of a three bit counter of the type shown in FIG. 2.
Figure 3B:
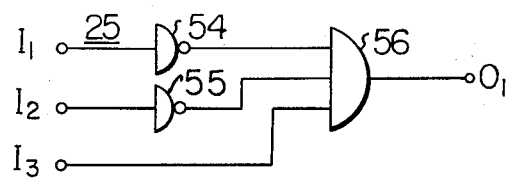
FIG. 3B is a schematic diagram of a threshold circuit of the type shown in FIG. 2.
Figure 3C:
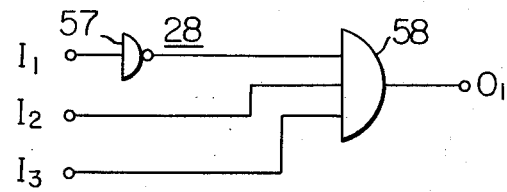
FIG. 3C is a schematic diagram of another type of threshold circuit as shown in FIG. 2.
Figure 3D:
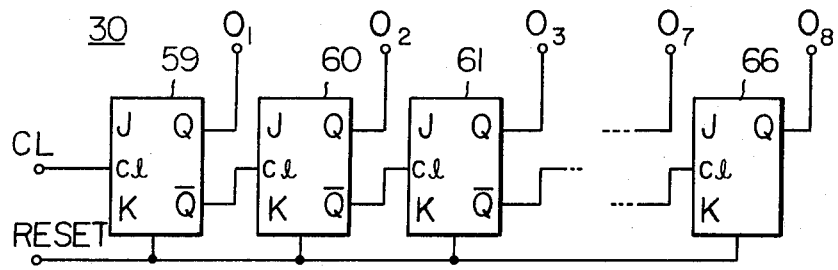
FIG. 3D is a detailed block diagram showing an 8 bit counter as shown in FIG. 2.
Figure 3E:
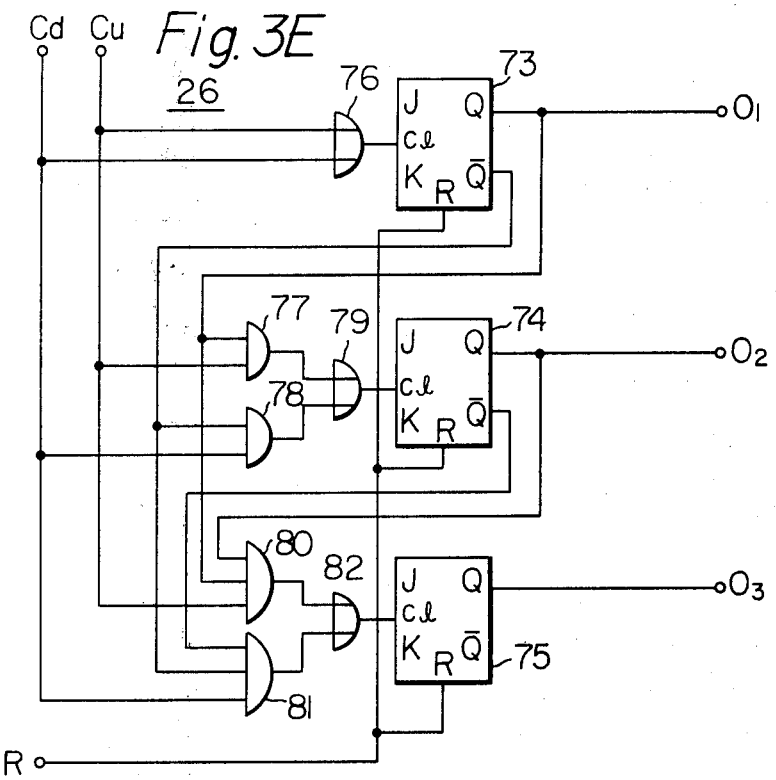
FIG. 3E is a schematic diagram of a 3 bit up-down counter as shown in FIG. 2.
Figure 3F:
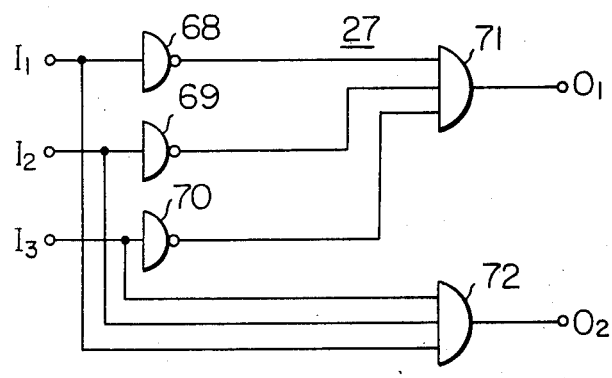
FIG. 3F is a schematic diagram of a logic circuit as shown in FIG. 2.
Figure 3G:
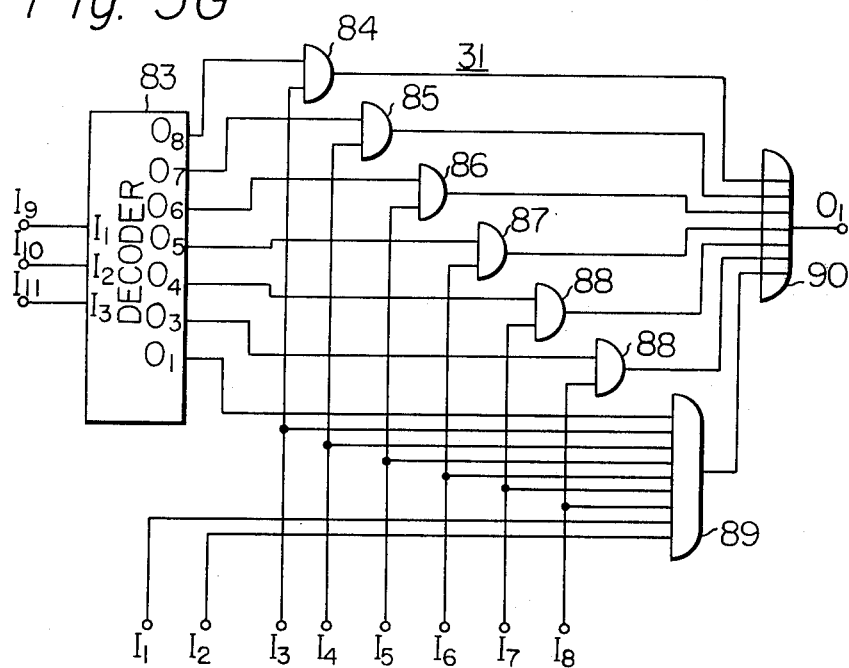
FIG. 3G is a schematic diagram of another type logic circuit as shown in FIG. 2.
Figure 3H:
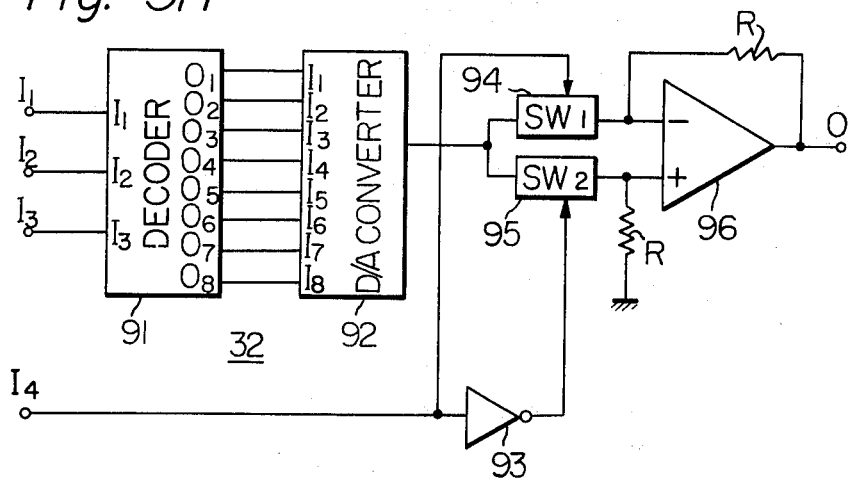
FIG. 3H is a schematic diagram of an integrating step generator as shown in FIG. 2.
Figure 31:
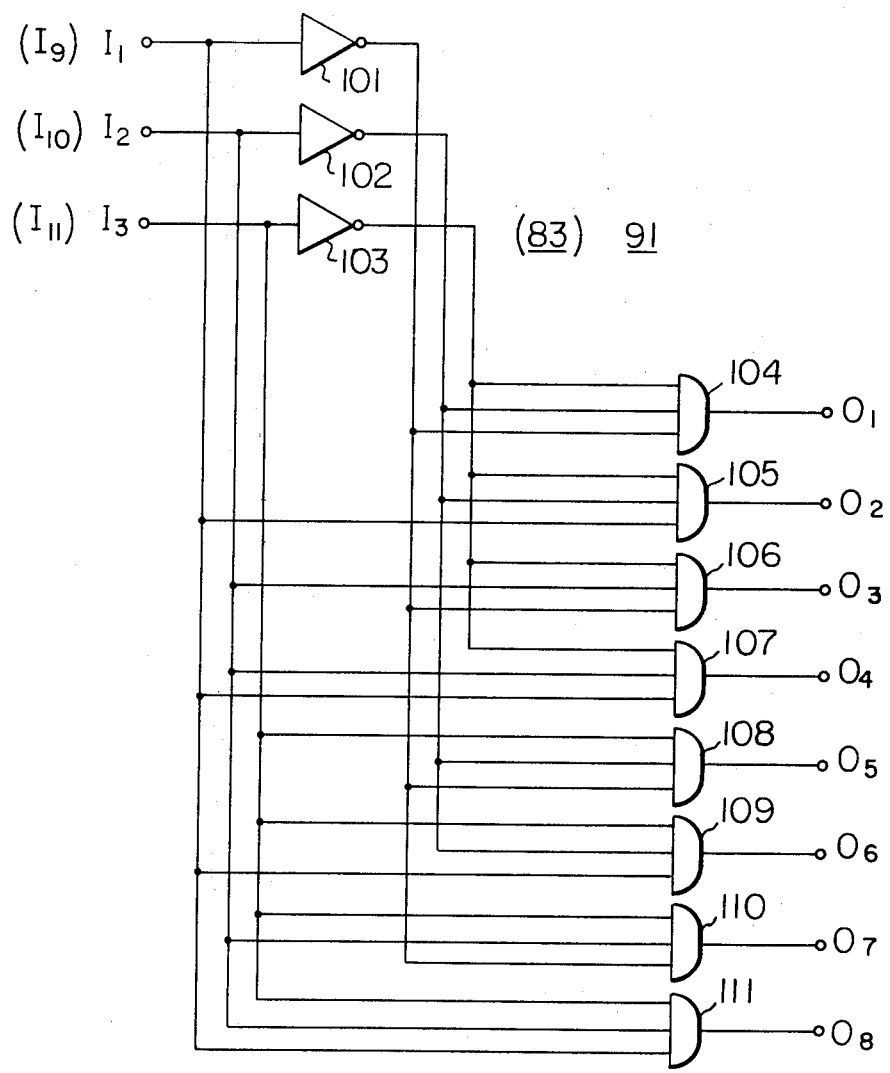

Next, the circuits of the respective sections are explained in detail with regard to the block diagram of FIG. 2. FIG. 3A shows the three bit counters 24 and 29 which consist of the three JK flip-flops 51, 52 and 53. The clock pulse which is applied to an input terminal CL is supplied to the terminal C1 of the JK flip-flop 51, and the output signal of terminal Q of each JK flip-flop is supplied to the output terminal $O_1$ through $O_3$. FIG. 3B shows the threshold circuit 25 which consists of two invertors 54, 55 and an AND circuit 56. The AND circuit 56 sends the output 1, when the output of the counter 24, which is applied to the input terminals I1, I2 and I3 of the threshold circuit 25, reaches 4. FIG. 3C shows threshold circuit 28 consisting of an invertor 57 and an AND circuit 58, and said AND circuit 58 sends an output 1 when the output of the counter 29 applied to the input terminals I1, I2, I3, respectively reaches the input level 5. FIG. 3D shows the eight bits counter which is the same as the three bits counter shown in FIG. 3A except that eight pieces of JK flip-flops 59 through 66 are contained therein. FIG. 3E shows the up-down counter 26 comprising JK flip-flops 73 through 75, AND circuits 77, 78, 80, 81 and OR circuits 76, 79, 82, and when the input of said counter 26 is applied from the input terminal Cu, the stepsize is raised, while the same falls when the input is applied from the input terminal Cd. FIG. 3F shows the logic circuit 27 comprising invertors 68 through 70 and AND circuits 71 and 72, which logic circuit 27 receives the output of the up-down counter 26 to the input terminals I1, I2, I3 thereof and sends the output 1 from the Gate circuit 72 when a value corresponding to the maximum stepsize is detected, while the same sends the output 1 from the Gate circuit 71 when a value corresponding to the minimum stepsize is detected. FIG 3G shows the logic circuit 31 consisting of input terminals I1 through I8, a decoder 83, AND circuits 84 through 89 and an OR circuit 90. The circuit of the decoder 83 is explained later in FIG. 3I. In the circuit 31, the value of the up-down counter 26 is read by a decoder 83 for the detection of the value of stepsize, and then the threshold level which corresponds to said stepsize is determined by the output of the decoder 83 and, the outputs of eight bit counter 30 applied to the input terminal I1 through I8, and the AND circuits 84 through 89, and is sent out from the output terminal $O_1$ through the OR gate 90. FIG. 3H shows the integrating step generator 32, consisting of the input terminals I1 through I3 for receiving the output of the up-down counter, a decoder 91, a DA convertor 92, an invertor 93, switches 94, 95 and a differential amplifier circuit 96 including two resistors R. The input from the input terminals I1 through I3 is decoded by the decoder 91 to be converted to an analog value by the known DA convertor 92. Then, either positive or negative polarity is given to the output thereof by the control voltage received through the input terminal I4 from the comparator 2, subsequently to be supplied to the integrator circuit. Also, FIG. 3I shows the decoders 83 and 91 consisting of invertors 101 through 103 and AND circuits 104 through 111, used in the reading of the three bit input to obtain a value of stepsize.

What is claimed is:

1. In an adaptive modulation apparatus including a means for comparing an analog input signal with an analog feedback signal to produce an adaptive delta modulation output signal wherein each bit of said output signal has a quantized stepsize, an adaptation logic circuit means connected to receive said output signal from said comparison means for monitoring and determining the stepsize value for each subsequent bit produced by said comparing means and generating a stepsize value signal, and an integrator circuit connected to receive said stepsize value signal from said adaptive logic circuit and producing said analog feedback signal, wherein the improvement in said adaptive logic circuit comprises:

first means for counting several preceding bits of said adaptive delta modulation output signal and producing a first stepsize change command signal when a predetermined number of identical bits are counted and a second stepsize change command signal when a predetermined number of sequentially alternating bits are counted;

second means for counting the number of bits of said adaptive delta modulation output signal from the time of the last stepsize change and producing a third stepsize change command signal when said number of bits counted reaches a number which is predetermined according to said quantized stepsize at that time; and third means for receiving said first, second and third stepsize change command signals, generating said stepsize value signal in response to any one of said command signals and changing said stepsize value signal in accordance therewith.

2. An adaptive delta modulation apparatus which includes a comparator provided with a first input terminal for receiving an analog input signal and a second input terminal, an adaptation logic circuit for receiving the output of said comparator, and an integrator circuit for receiving the output of said adaptation logic circuit and supplying an output to said second input terminal of said comparator, wherein said adaptation logic circuit comprises:

a. a first counter connected to the output of said comparator for counting the number of successive identical signal bits within a sequence of adaptive delta modulation bits;

b. a second counter connected to the output of said comparator for counting the number of successive alternating signal bits within a sequence of the adaptive delta modulation bits;

c. an up and down counter for counting up in accordance with the output of said first counter and counting down in accordance with the output of said second counter;

d. a first logic circuit for receiving the output of said up and down counter, inhibiting a count up of said up and down counter when said first logic circuit detects a value corresponding to the maximum step value of said up and down counter, and inhibiting a count down of said up and down counter when said first logic circuit detects a value corresponding to the minimum step value of said up and down counter;

e. a second logic circuit for reading the value of said up and down counter, detecting the stepsize used each time and determining a threshold value in accordance with said stepsize;

f. a third counter for receiving the output of said second logic circuit, counting clock pulses starting from the time when said stepsize is changed and causing said up and down counter to count down by one stepsize when the counted value of clock pulses reaches said threshold value determined by said second logic circuit; and g. an integrating step generator for reading the value of said up and down counter, converting said value into an analog signal, switching the polarity of said analog signal in response to the output value of said comparator and applying said analog signal to said integrator circuit.

3. An adaptive delta modulation apparatus according to claim 2, further comprising, a. a time delay circuit connected to the output of said comparator so as to delay the bits of said adaptive modulation with the time delay corresponding to one sample period, and b. an exclusive OR gate connected to the output of said time delay circuit, for sending 1 to said adaptation logic circuit when two successive bits are of the same kind, and 0 when two successive bits are of a different kind.

4. An adaptive delta modulation apparatus according to claim 2, wherein said adaptation logic circuit further comprises, a. a first threshold circuit connected between said first counter and said up and down counter for detecting the time at which the output of said first counter reaches the predetermined value, and b. a second threshold circuit which is connected between said second counter and said up and down counter and detects the time at which the output of said second counter reaches the predetermined value.

5. An adaptive delta modulation apparatus according to claim 4, wherein said adaptation logic circuit further comprises an inverter provided between the output of said first threshold circuit and said up and down counter, whereby said up and down counter counts up when the output of said threshold circuit and the output of said second logic circuits become 1 at the same time.

* * * * *

UNITED STATES PATENT AND TRADEMARK OFFICE
CERTIFICATE OF CORRECTION

PATENT NO. : 3,995,218

DATED : November 30, 1976

INVENTOR(S) : Takao Moriya

It is certified that error appears in the above-identified patent and that said Letters Patent are hereby corrected as shown below:

In the Abstract, line 1, "disclosed" should be --discloses--.
Column 1, line 16, ", the" should be --.  The--.
Column 1, line 20, after "signal" insert --output from the comparator--.
Column 1, line 21, delete "from the comparator"; after "whether" insert --the--.
Column 1, line 31, "a" should be --an--.
Column 2, line 7, "king" should be --kind--.
Column 5, line 26, "kn(1  n  L)" should be --Kn($1 \leq n \leq L$)--.
Column 6, line 42, ", while a" should be --.  A--.
Column 6, line 48, "When the" should be --.  The--.
Column 6, line 51, delete "of".
Column 6, line 53, ", while" should be --.  When--.
Column 6, line 59, after "is" insert --also--.
Column 6, line 66, "of" should be --by--, "by" should be -- of --
Column 7, line 8, delete "at least,".
Column 7, line 9, after "and" insert --when--.
Column 7, line 29, "the" (second occurrence) should be --two--
Column 7, line 30, delete "two".
Column 7, line 31, "the" should be --two--.
Column 7, line 31, delete "two".
Column 7, line 38, "of" should be --at--.
Column 7, lines 43 and 44, "I1, I2 and I3" should be --$I_1, I_2$ and $I_3$--.
Column 7, line 48, "I1, I2, I3" should be --$I_1, I_2, I_3$--.
Column 7, line 51, delete "pieces of".
Column 7, line 55, ", and when" should be --.  When--.
Column 7, line 56, "from" should be --to--.
Column 7, line 60, ", which logic" should be --.  Logic--.
Column 7, line 61, "to" should be --at--.
Column 7, line 62, "I1, I2, I3" should be --$I_1, I_2, I_3$--.
Column 7, line 68, "I1" should be --$I_1$--.
Column 7, line 68, "I8" should be --$I_8$--.

UNITED STATES PATENT AND TRADEMARK OFFICE
CERTIFICATE OF CORRECTION

PATENT NO. : 3,995,218

DATED : November 30, 1976

INVENTOR(S) : Takao Moriya

It is certified that error appears in the above-identified patent and that said Letters Patent are hereby corrected as shown below:

Column 8, line 3, delete "a".
Column 8, line 4, ", and then the" should be --. The--.
Column 8, line 5, after "said" insert --present--.
Column 8, line 6, after "83" insert --,--.
Column 8, line 6, delete "," after "and".
Column 8, line 7, after "of" insert --the--.
Column 8, line 7, after "30" insert --are--.
Column 8, line 8, "terminal I1 through I8," should be --terminals $I_1$ through $I_8$,--.
Column 8, line 9, ", and is" should be --to cause an output signal to be--.
Column 8, line 11, "I1" should be --$I_1$--.
Column 8, line 12, "I3" should be --$I_3$--.
Column 8, line 13, "after "counter" insert --26--.
Column 8, line 16, "I1 through I3" should be --$I_1$ through $I_3$--.
Column 8, line 20, "I4" should be --$I_4$--.

Signed and Sealed this

Tenth Day of May 1977

[SEAL]

Attest:

RUTH C. MASON
Attesting Officer

C. MARSHALL DANN
Commissioner of Patents and Trademarks